United States Patent
Houston

(10) Patent No.: US 6,735,143 B2
(45) Date of Patent: May 11, 2004

(54) SYSTEM FOR REDUCING POWER CONSUMPTION IN MEMORY DEVICES

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/320,222

(22) Filed: Dec. 16, 2002

(65) Prior Publication Data

US 2003/0122201 A1 Jul. 3, 2003

Related U.S. Application Data

(60) Provisional application No. 60/344,521, filed on Dec. 28, 2001.

(51) Int. Cl.[7] .................................................. G11C 7/00
(52) U.S. Cl. ..................... 365/227; 365/230.06; 365/226
(58) Field of Search ........................... 365/227, 230.06, 365/226, 230.08

(56) References Cited

U.S. PATENT DOCUMENTS 5,544,123 A * 8/1996 Hoshi et al. ........... 365/230.06
6,512,715 B2 * 1/2003 Okamoto et al. ........... 365/227

* cited by examiner

*Primary Examiner*—Huan Hoang
(74) *Attorney, Agent, or Firm*—Peter K. McLarty; W. James Brady, III; Frederick J. Telecky Jr.

(57) ABSTRACT

The present invention provides a system for reducing power consumption in a memory device containing a memory array having a number of memory cells. The present invention raises a supply voltage of a row of memory cells from a first voltage to a second voltage whenever the row of memory cells is selected for access (102) and lowers the supply voltage of the row of selected memory cells from the second voltage to the first voltage after the row of selected memory cells has been accessed (106). The first voltage is low enough to reduce power consumption of the memory device, but is high enough to retain data stored in the memory device. The second voltage is a nominal operating voltage sufficient to access the row of selected memory cells while maintaining the performance and stability of the row of selected memory cells.

11 Claims, 3 Drawing Sheets

SYSTEM FOR REDUCING POWER CONSUMPTION IN MEMORY DEVICES

PRIORITY CLAIM

This patent application claims priority of U.S. Provisional Application No. 60/344,521, filed on Dec. 28, 2001.

TECHNICAL FIELD OF THE INVENTION

The present invention relates generally to the field of semiconductor devices, and more particularly to a system for reducing power consumption in memory devices.

BACKGROUND OF THE INVENTION

Memory systems are known in the art and used in nearly all microprocessor and digital equipment applications. Memory systems generally utilize different types of memory for different applications. Once such type of memory is Static Random Access Memory ("SRAM"). SRAM systems have the advantage of high speed and ease of use as compared to some other types of memory systems. In addition, SRAM systems using MOS technology exhibit extremely low standby power and do not require a refresh cycle to maintain the information stored in the SRAM system. These attributes make SRAM systems particularly desirable for portable equipment, such as laptop computers. As a result, SRAM arrays are becoming an increasingly large portion of many integrated circuits.

In an integrated circuit, SRAM systems are often organized into an array of memory cells, arranged in rows and columns. Generally, memory cells are set to one of two data states when storing a bit of information. Each memory cell may be referenced by a unique memory address, which includes a row address and a column address. The term "wordline" generally refers to one or more conductors that correspond to a row of memory cells, whereas the term "bitlines" generally refers to a set of conductors that correspond to a column of memory cells. A memory cell typically includes of pair of complementary ports, with each port connected to one of the two bitlines dedicated to that column. Memory devices commonly operate in a read mode and a write mode. When writing to a memory cell, the wordline is activated, thereby activating the entire row in the array of memory cells. A differential current is applied to the bitlines between the two complementary input/output ports of the memory cell. The memory cell is latched to a specific logic state with a logic high indicated on one port and a logic low indicated on the other port. When reading from a memory cell, the wordline is activated and the logic states on the bitlines associated with the memory cell is differentially sensed using a sense amplifier. The sense amplifier outputs an amplify signal corresponding to the logic state written to the memory cell.

The easiest way to lower the power consumption of a SRAM memory array is to lower the voltage. But, lowering the voltage reduces the performance and stability of the memory array. One method of reducing the power consumption of a memory device is to lower the supply voltage $V_{DD}$ for the memory array. The bitlines, which are connected to the memory cells, are pre-charged with the supply voltage and the supply voltage is then boosted to derive an array voltage, which is applied to the memory cells at a boosted level higher than the supply voltage. The memory cells are accessed by applying a wordline voltage that is greater than the supply voltage and less than the sum of the supply voltage and the threshold voltage of the access transistors. Although this method works, it is more difficult (more load) to drive $V_{DD}$ than it is to drive the wordline. Moreover, there are timing issues of $V_{DD}$ row relative to the wordline, which causes slower memory access.

As a result, there is a need for a system for reducing the power consumption of a memory device in an easier and more efficient manner.

SUMMARY OF THE INVENTION

The present invention provides a system for reducing the power consumption of a memory device in an easier and more efficient manner. More specifically, the present invention reduces the voltage to the memory array, thus reducing array $I_{DDQ}$ and reducing the power consumption of the memory device. To maintain performance and stability of the accessed cells, the voltage is raised to the accessed rows before accessing the memory cells. The access may also be pipelined in order to allow more time to raise the row supply voltage relative to the time for raising the word line voltage. For example, the row voltage is raised in a first cycle and the memory cell is accessed (raise wordline voltage) in the following cycle. With pipelining, there can be one access per cycle with one cycle latency. Additional latency/pipelining could be used if necessary. Note that the supply voltage could be raised to a block of rows containing the accessed row instead of only the addressed row. SRAM $I_{DDQ}$ can be lowered significantly by lowering row $V_{DD}$, especially when row $V_{DD}$ is lowered relative to n-well. Resistance in row $V_{DD}$ does not significantly affect performance.

An SRAM array is provided, in which row $V_{DD}$ is lowered for the entire array except for the addressed row during active. $V_{DD}$ to the addressed row is restored to nominal for access. The read cycle needs to be long enough to include time to restore $V_{DD}$ row to the addressed row. If necessary, the read cycle can extend over multiple clock cycles. Note that multiple rows can be powered together. In addition, the voltage restoration and cell access can be pipelined (start restoration of $V_{DD}$ row to a second row while accessing a first row). Another option is simply to lower $V_{DD}$ to the array and wordline drivers, and allows more time for the sense amp latch. Raising the addressed $V_{DD}$ row becomes worthwhile if either: pipelining is used for faster cycles, or $V_{DD}$ row is lowered enough to make access very slow or impossible, e.g. to around $V_{BOX}$ low. Note that when $V_{DD}$ row is lowered significantly, the addressed $V_{DD}$ row may be raised to some value still below nominal for access.

More specifically, the present invention provides a method for reducing power consumption in a memory device containing a memory array having a number of memory cells by raising a supply voltage of a row of memory cells from a first voltage to a second voltage whenever the row of memory cells is selected for access and lowering the supply voltage of the row of selected memory cells from the second voltage to the first voltage after the row of selected memory cells has been accessed. The first voltage is low enough to reduce power consumption of the memory device, but is high enough to retain data stored in the memory device. The second voltage is a nominal operating voltage sufficient to access the row of selected memory cells while maintaining the performance and stability of the row of selected memory cells.

The present invention also provides an apparatus for reducing power consumption in a memory device containing a memory array having a number of memory cells. A first transistor and a second transistor are coupled in parallel between a supply voltage and a supply voltage for a row of memory cells. A row select line is coupled to the gate of the first transistor. The first transistor and the second transistor connected such that the supply voltage of the row of memory cells is raised from a first voltage to a second voltage whenever the row select line is enabled and lowering the supply voltage of the row of memory cells from the second voltage to the first voltage whenever the row select line is disabled.

In addition, a circuit can be added to pipeline the raising and lowering of the supply voltage of the row of memory cells. The pipeline circuit comprises includes a first latch and a second latch coupled to an address line, a first address decoder coupled to the first latch, a second address decoder coupled to the second latch, an OR (NOR) gate coupled to the output of the first address decoder and the second address decoder. The OR (NOR) gate provides a row select signal. Morevoer, a first pass circuit is coupled to the first address decoder, a second pass circuit is coupled to the second address decoder. The output of the first pass circuit and second pass circuit provide a wordline select signal.

The present invention also provides a system for reducing power consumption in a memory device containing a memory array having a number of memory cells and a power reduction circuit within each row of memory cells. Each power reduction circuit has a first transistor and a second transistor coupled in parallel between a supply voltage and a supply voltage for a row of memory cells, and a row select line coupled to the gate of the first transistor. The first transistor and the second transistor are connected such that the supply voltage of the row of memory cells is raised from a first voltage to a second voltage whenever the row select line is enabled and lowering the supply voltage of the row of memory cells from the second voltage to the first voltage whenever the row select line is disabled. A pipeline circuit may also be used in this system.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

Figure 1:
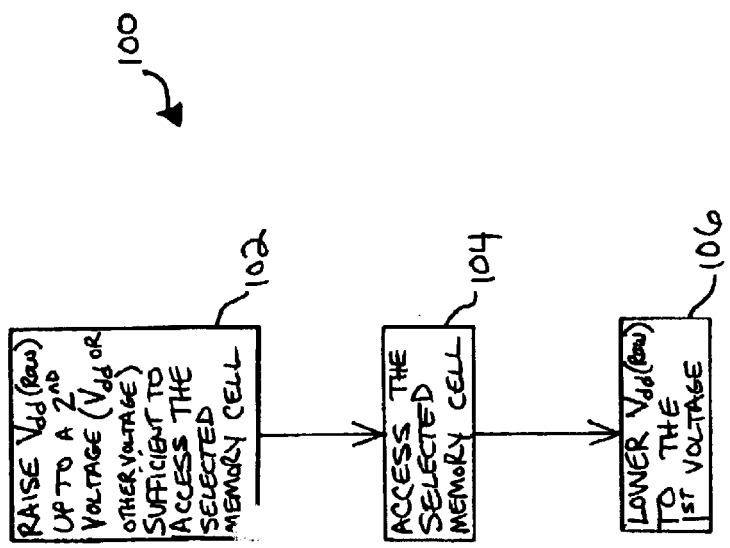
FIG. 1 is a flow chart illustrating a process to reduce power consumption in accordance with the present invention.

While the making and using of various embodiments of the present invention are discussed in detail below, it should be appreciated that the present invention provides many applicable inventive concepts, which can be embodied in a wide variety of specific contexts. The invention will now be described in conjunction with any memory. The specific embodiments discussed herein are merely illustrative of specific ways to make and use the invention and do not limit the scope of the invention.

The $I_{DDQ}$ (i.e., leakage current) of the memory array is a significant portion of active power consumed by large embedded memories, such as SRAM memory arrays. In fact, the gate current is a significant portion of this leakage current. Moreover, the SRAM leakage current is significant even relative to the active power of the device. Accordingly, the present invention provides system, method and apparatus for reducing the power consumption of a memory device in an easier and more efficient manner. More specifically, the present invention reduces the voltage to the memory array, thus reducing array leakage current and reducing the power consumption of the memory device. To maintain performance and stability of the accessed cells, the voltage is raised to the accessed rows before accessing the memory cells. The access may also be pipelined in order to allow more time to raise the row supply voltage relative to the time for raising the word line voltage. For example, the row voltage is raised in a first cycle and the memory cell is accessed (raise wordline voltage) in the following cycle. With pipelining, there can be one access per cycle with one cycle latency. Additional latency/pipelining could be used if necessary. Note that the supply voltage could be raised to a block of rows containing the accessed row instead of only the addressed row. SRAM leakage current can be lowered significantly by lowering $V_{DD}$ row, especially when row $V_{DD}$ is lowered relative to n-well. Resistance in row $V_{DD}$ does not significantly affect performance.

An SRAM array in which array $V_{DD}$ row is lowered for the entire array except for the addressed row during active. $V_{DD}$ to the addressed row is restored to nominal for access. The read cycle needs to be long enough to include time to restore $V_{DD}$ row to the addressed row. If necessary, the read cycle can extend over multiple clock cycles. Note that multiple rows can be powered together. In addition, the voltage restoration and cell access can be pipelined (start restoration of $V_{DD}$ row to a second row while accessing a first row). Another option is simply to lower $V_{DD}$ to the row and wordline drivers, and allows more time for the sense amp latch. Raising the addressed $V_{DD}$ row becomes worthwhile if either: pipelining is used for faster cycles, or $V_{DD}$ row is lowered enough to make access very slow or impossible, e.g. to around $V_{BOX}$ low. Note that when $V_{DD}$ array is lowered significantly, the addressed $V_{DD}$ row may be raised to some value still below nominal for access.

Referring to FIG. 1, a flow chart illustrating a process or method 100 to reduce the power consumption of a memory device in accordance with the present invention is shown. The memory device contains a memory array having a number of memory cells. Power consumption of the memory device is reduced by maintaining the supply voltage of the memory array at a first voltage until a memory cell is selected for access. When a memory cell is selected for access, the supply voltage of $V_{DD}$ row of the selected memory cell is raised from a first voltage to a second voltage in block 102. The first voltage is low enough to reduce the power consumption of the memory device, but high enough to retain the data (0 or 1) stored in the memory device. The second voltage is a nominal operating voltage $V_{DD}$ or other voltage sufficient to access the selected memory cell while maintaining the performance and stability of the selected memory cell. The selected memory cell is then accessed in block 104. After the selected memory cell has been accessed, the supply voltage of the selected memory cell $V_{DD}$ row is lowered from the second voltage to the first voltage.

The method 100 can be pipelined so that there is no increase in cycle time with one cycle latency. In such a case, the supply voltage, $V_{DD}$ row, of the next selected memory cell row is raised from a first voltage to a second voltage at the same time the first selected memory cell is accessed. Note that $V_{SS}$ for the row can be shifted as well as $V_{DD}$ for the row, although $V_{SS}$ for the row needs to supply more current than $V_{DD}$ for the row for a read operation. Moreover, the power control can be done at the block level instead of the individual row level.

Figure 2A:
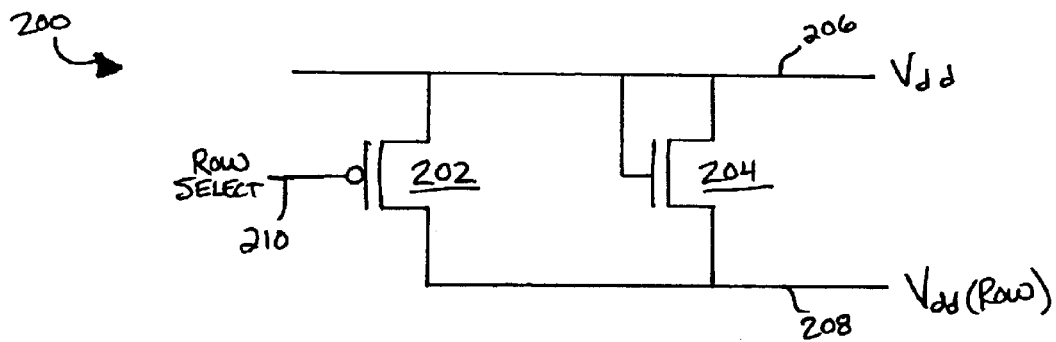
FIGS. 2A and 2B are schematic diagrams of various circuits to reduce power consumption in accordance with the present invention.
Figure 2B:
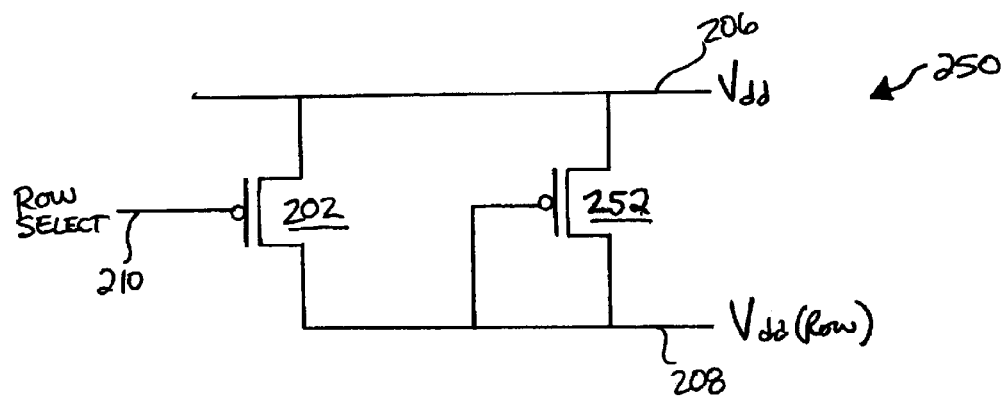

Now referring to FIGS. 2A and 2B, schematic diagrams of various circuits 200 and 250 to reduce power consumption of a memory device in accordance with the present invention are shown. The power supply for the memory array may be an external power source or derived on-chip. The power supply creates a supply voltage, $V_{DD}$, that is applied to memory voltage circuit 200 or 250. Memory voltage circuit 200 or 250 raises or lowers the memory voltage, $V_{DD}$ row, for each row of memory cells in the memory array.

The memory voltage circuit 200 of FIG. 2A includes two transistors 202 and 204 connected in parallel between supply voltage $V_{DD}$ 206 and memory voltage $V_{DD}$ row 208. The gate of transistor 202 is coupled to the row select line 210 for the row of memory cells in the memory cell. The gate of transistor 204 is coupled to the supply voltage $V_{DD}$ 206. As shown, transistor 202 is a p-channel transistor and transistor 204 is a n-channel transistor. When the row select 210 is high (turn off), $V_{DD}$ row 208 is at a first voltage. The first voltage is low enough to reduce the power consumption of the memory device, but high enough to retain the data (0 or 1) stored in the memory device. When the row select 210 is low (turn on), $V_{DD}$ row 208 is at a second voltage. The second voltage is a nominal operating voltage $V_{DD}$ 206 or other voltage sufficient to access the selected memory cell while maintaining the performance and stability of the selected memory cell. Additional transistors and components can be added to circuit 200 to customize the circuit to a specific application or range between the first voltage and the second voltage.

A comparison of the power saved by lowering the array $V_{DD}$ row 208 to the power required to modulate row $V_{DD}$ is shown below. Row modulation: Power=$C \times V_{DD} \times dV_{DD} \times f$. For C=2 pF (estimate for 512 columns), $V_{DD}$=1.3V, $dV_{DD}$=0.7V, f=250 MHz and Power=455 uW. Need leakage current reduction>>350 uA. For C027.A with V n-well=1.3V: leakage current/Mbit:

|  | $V_{DD}$ | 27 C | 55 C |
|---|---|---|---|
| Nominal: | 1.3 | 0.5 mA | 1.5 mA |
|  | 1.0 | 0.22 mA | 0.73 mA |
|  | 0.6 | 0.1 mA | 0.38 mA |
| Strong: | 1.3 | 2.9 mA | 8.3 mA |
|  | 1.0 | 1.3 mA | 4.2 mA |
|  | 0.6 | 0.64 mA | 2.2 mA |

Similarly, the memory voltage circuit 250 of FIG. 2B includes two transistors 202 and 252 connected in parallel between supply voltage $V_{DD}$ 206 and memory voltage $V_{DD}$ row 208. The gate of transistor 202 is coupled to the row select line 210 for the row of memory cells in the memory cell. The gate of transistor 252 is coupled to the memory voltage $V_{DD}$ row 208. As shown, transistors 202 and 252 are p-channel transistors. When the row select 210 is high (turn off), $V_{DD}$ row 208 is at a first voltage. The first voltage is low enough to reduce the power consumption of the memory device, but high enough to retain the data (0 or 1) stored in the memory device. When the row select is low 210 (turn on), $V_{DD}$ row 208 is at a second voltage. The second voltage is a nominal operating voltage $V_{DD}$ 206 or other voltage sufficient to access the selected memory cell while maintaining the performance and stability of the selected memory cell. Additional transistors and components can be added to or replace circuit 250 to customize the circuit to a specific application or range between the first voltage and the second voltage. For example, the row voltage can be switched between a first voltage generated on chip and the supply voltage, $V_{DD}$. Alternatively, the row voltage can be switched between a first voltage and a second voltage, each derived from a supply voltage.

The row select 210 for powering up (raising $V_{DD}$ row 208 to the second voltage (high)) for the selected row is to go low (turn on) some time before the wordline is turned on. This can be accomplished one cycle in advance. Using this two-cycle process, the memory cells are accessed every other cycle. Multiple cycles may also be used. Alternatively, delay may be implemented within the same cycle by turning on the row select 210 to raise $V_{DD}$ row 208 and then turn on the selected wordline within the same cycle. The $V_{DD}$ row 208 can be returned to the first voltage (low) concurrently or after turning off the wordline. As a result of the capacitance on $V_{DD}$ row 208, the turn off of the raised $V_{DD}$ row 208 may be started in advance of turning the wordline off. The $V_{DD}$ row 208 should not go low while the wordline is on because that can cause memory cell upset of inadequate noise margin. This restriction is not needed if there is adequate noise margin at $V_{DD}$ row 208 low (where $V_{DD}$ is raised for higher performance).

The advantage of relatively fast turn off of $V_{DD}$ row 208 high is saving leakage current power. However, there are advantages for keeping the row select 210 for the raised $V_{DD}$ row 208 on into the next cycle if the same row is selected again (reduce AC power) or if the row changes and the previous one is kept on while turning on the newly selected row will add capacitance locally to $V_{DD}$ 206 reducing perterbation on $V_{DD}$ 206. Having a multiple cycle pipeline (e.g., turning on one or more cycles before the wordline is turned on) increases latency but also reduces ripple on $V_{DD}$ 206.

Figure 3:
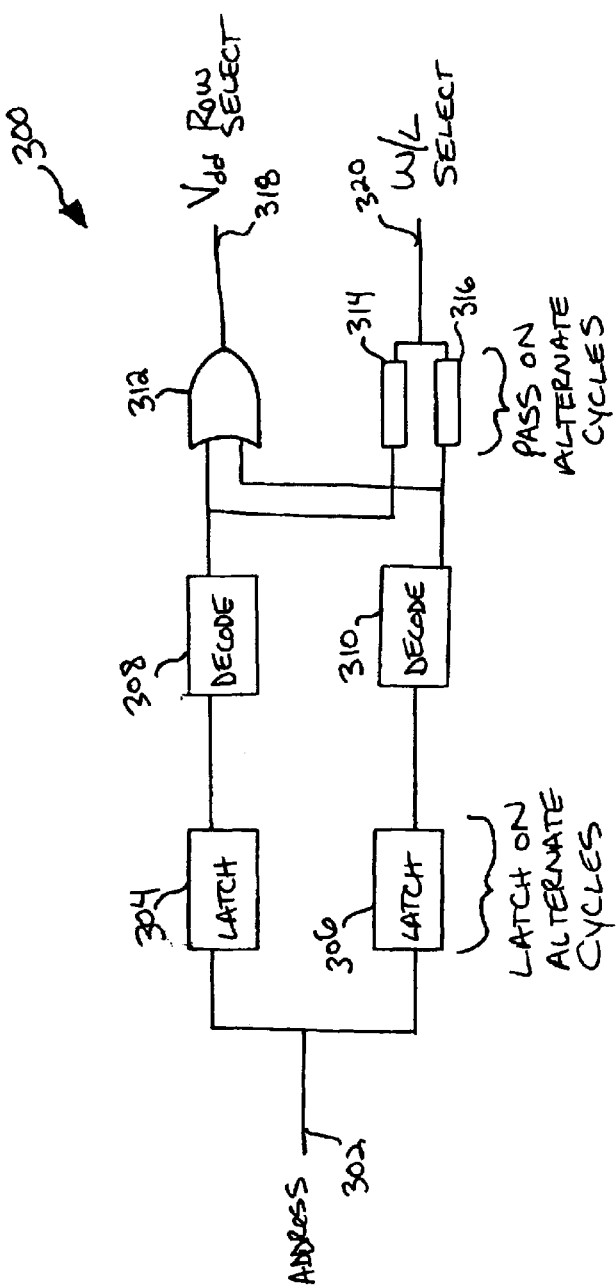
FIG. 3 is a schematic diagram of a circuit to reduce power consumption in accordance with an embodiment of the present invention.

Now referring to FIG. 3, a schematic diagram of a circuit 300 to reduce power consumption in accordance with another embodiment of the present invention is shown. Assuming a two-cycle pipeline, circuit 300 has two sets of address decoders 308 and 310 with address 302 latched in alternate cycles. The $V_{DD}$ row is selected by an OR (NOR) gate 312 of the two address decode results. More specifically, address 302 is coupled to a first latch 304 and a second latch 306. The first latch 304 is coupled to a first address decoder 308. Likewise, the second latch 306 is coupled to the second address decoder 310. The outputs from the first address decoder 308 and the second address decoder 310 are coupled to the OR (NOR) gate 312, which provides the $V_{DD}$ row select 318. The first address decoder 308 is also coupled to a first pass circuit 314. Similarly, the second address decoder 310 is coupled to a second pass circuit 316. The outputs of the first pass circuit 314 and second pass circuit 316 provide the wordline select 320. Having the wordline selected on the second cycle of both decoders using gates to pass on alternate cycles. Since the wordline is selected on the second cycle of the address decode, it can be selected early in the cycle without waiting on the address decode assuming that allows enough time to have raised $V_{DD}$ row. Then, the added latency is a half cycle instead of a full cycle.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method for reducing power consumption in a memory array, comprising the steps of:
   maintaining a supply voltage of said memory array at a first voltage less than an external supply voltage $V_{DD}$;
   raising the supply voltage across of a row of memory cells of said memory array from the first voltage to a second voltage whenever the row of memory cells is selected for access; and
   lowering the supply voltage across the row of selected memory cells from the second voltage to the first voltage after the row of selected memory cells has been accessed.

2. The method as recited in claim 1, wherein the first voltage is less than a supply voltage $V_{DD}$ and the second voltage is equal to the supply voltage $V_{DD}$.

3. The method as recited in claim 1, wherein the first voltage is low enough to reduce power consumption of the memory device, but is high enough to retain data stored in the memory device.

4. The method as recited in claim 1, wherein the second voltage is a nominal operating voltage sufficient to access the row of selected memory cells while maintaining the performance and stability of the row of selected memory cells.

5. The method as recited in claim 1, further comprising the step of raising the supply voltage of a second row of memory cells from the first voltage to the second voltage while the selected row of memory cells is being accessed.

6. The method as recited in claim 1, wherein the memory device comprises an SRAM memory array.

7. An apparatus for reducing power consumption in a memory device comprising:
   a first transistor and a second transistor coupled in parallel between an external supply voltage and a supply voltage coupled to a row of memory cells;
   coupling a gate terminal of said second transistor to said supply voltage;
   a row select line coupled to the gate of the first transistor; wherein
      the first transistor and the second transistor couple such that the supply voltage of coupled to the row of memory cells raises from a first voltage to a second voltage whenever the row select line is enabled and lowers whenever the row select line is disabled.

8. The apparatus as recited in claim 7, wherein the first voltage is less than the external supply voltage and the second voltage is equal to the external supply voltage.

9. The apparatus as recited in claim 7, wherein the first transistor is a p-channel transistor, and the second transistor is a n-channel transistor having a gate coupled to the supply voltage.

10. The apparatus as recited in claim 7, further comprising a pipeline circuit for raising and lowering the supply voltage of the row of memory cells.

11. The apparatus as recited in claim 10, wherein the pipeline circuit comprises:
    a first latch and a second latch coupled to an address line;
    a first address decoder coupled to the first latch;
    a second address decoder coupled to the second latch;
    an OR (NOR) gate coupled to the output of the first address decoder and the second address decoder, the OR (NOR) gate providing a row select signal;
    a first pass circuit coupled to the first address decoder;
    a second pass circuit coupled to the second address decoder; wherein
       the output of the first pass circuit and second pass circuit provide a wordline select signal.

* * * * *